United States Patent [19]

Wieder

[11] 4,336,604
[45] Jun. 22, 1982

[54] MONOLITHIC STATIC MEMORY CELL

[75] Inventor: Armin Wieder, Gauting, Fed. Rep. of Germany

[73] Assignee: Siemens Aktiengesellschaft, Berlin & Munich, Fed. Rep. of Germany

[21] Appl. No.: 169,449

[22] Filed: Jul. 16, 1980

[30] Foreign Application Priority Data

Aug. 31, 1979 [DE] Fed. Rep. of Germany ....... 2935291

[51] Int. Cl.³ ............................................. G11C 11/40
[52] U.S. Cl. .................................... 365/182; 365/189; 357/45
[58] Field of Search ................. 365/174, 182, 189, 23; 357/40, 45, 52

[56] References Cited

U.S. PATENT DOCUMENTS 4,288,863  9/1981  Adam .................................. 365/182
4,298,962 11/1981  Hamano et al. .................... 365/182

OTHER PUBLICATIONS

Stein et al., "Storage Array and Sense/Refresh Circuit for Single-Transistor Memory Cells," IEEE Journal of Solid-State Circuits, Semiconductor Memory Design and Applications, pp. 117-119, vol. SC-7, No. 5, Oct. 1972, pp. 336-340.

Kroger et al., "Steady-State Characteristics of Two-Terminal Inversion-Controlled Switches", Solid State Electronics 1978, vol. 21, pp. 643-654.

Primary Examiner—Terrell W. Fears
Attorney, Agent, or Firm—Hill, Van Santen, Steadman, Chiara & Simpson

[57] ABSTRACT

A monolithic static memory cell has a region of a first conductivity type extending from the upper surface of a semiconductor layer of a second conductivity type carried on a semiconductor body of the first conductivity type and connected to a first drive line. A first zone of the semiconductor layer adjacent the region is covered by a gate connected to a second drive line and separated from the semiconductor layer by a gate insulator. A second zone adjacent the first zone is covered by a conductive coating connected to a supply terminal, the conductive coating being separated from the surface of the semiconductor layer by a thin electrically insulating layer which admits a tunnel current between the surface of the semiconductor layer and the conductive coating.

18 Claims, 11 Drawing Figures

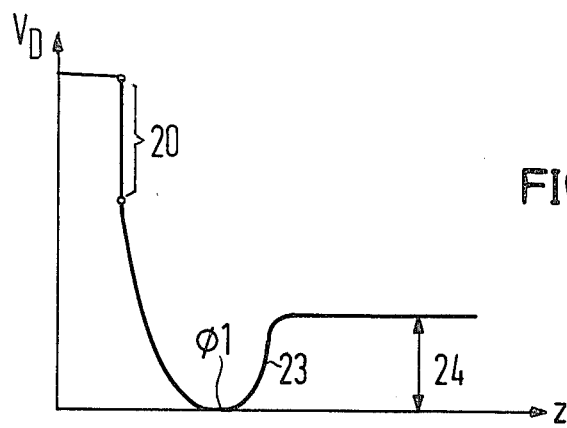
FIG4
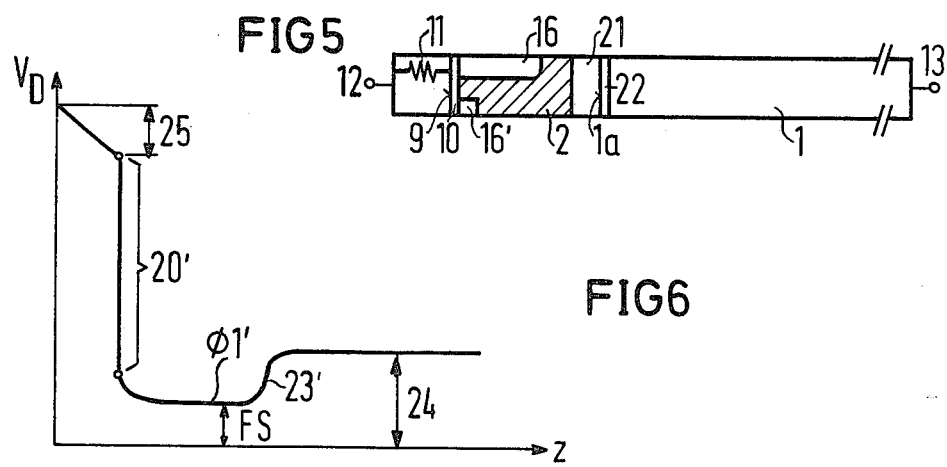
FIG5
FIG6
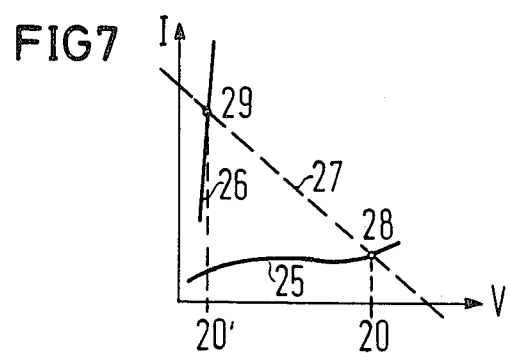
FIG7

MONOLITHIC STATIC MEMORY CELL

BACKGROUND OF THE INVENTION

1. Field of the Invention

The invention relates to a memory cell, and more particularly to a monolithic static memory cell.

2. Description of the Prior Art

Static random access memory (RAM) cells are known which consist of a plurality of field effect transistors constructed in metal-insulator-semiconductor (MIS) technology integrated on a semiconductor body. In this regard, reference may be taken to the book of Luecke, Mize and Carr, *"Semiconductor Memory Design and Application"*, McGraw-Hill Kogakusha Ltd., Tokyo, pp. 117-119. For the realization of such a memory cell, a part of a boundary surface of a semiconductor body corresponding to the plurality of field effect transistors must be made available. On the other hand, dynamic single transistor memory cells integrated on a semiconductor body are known (cf. IEEE Journal of Solid State Circuits, Vol. SC-7, No. 5, October 1972, pp. 336-340) which require a significantly smaller part of the boundary surface but which, however, must be operated in such a manner that the digital information stored therein must be periodically read, regenerated and rewritten. Even upon reading of the stored information, a regeneration of the information is required.

SUMMARY OF THE INVENTION

The object of the present invention is to provide a static memory cell which can be realized on a significantly smaller semiconductor surface than the traditional static memory cell.

The above object is achieved in a static memory cell by providing that a semiconductor body of a first conductivity type carry a semiconductor layer thereon of a second conductivity type in which a region is provided at the upper surface of the semiconductor layer and connected to a first drive line. A first zone of the semiconductor layer adjacent the region carries an insulator which supports a gate connected to a second drive line. A second zone of the semiconductor layer adjacent the first zone is covered by a conductive coating connected to a second terminal, the coating being separated from the surface by a thin electrically insulating layer which admits a tunnel current between the upper surface and the conductive coating.

The static memory cell constructed in accordance with the present invention is particularly characterized by the fact that it has a small semiconductor surface requirement comparable to that of a dynamic single transistor memory cell without having the disadvantages of periodic regeneration of the stored digital information, as discussed above, occur as in dynamic memory cells. Therefore, the static memory cell of the present invention, upon application in semiconductor memories, permits an increase of the bit density to values which can otherwise only be achieved with dynamically-operated memory cells, without having to suffer the added circuit expense necessary in the latter for a regeneration and clock pulsing.

BRIEF DESCRIPTION OF THE DRAWINGS

Other objects, features and advantages of the invention, its organization, construction and operation will be best understood from the following detailed description, taken in conjunction with the accompanying drawings, on which:

FIG. 4 is a graphic illustration of a potential curve relating to FIGS. 2 and 5;

FIG. 5 is a schematic cross section of a memory cell in which the potential curves according to FIGS. 4 and 6 occur;

FIG. 6 is a graphic illustration of a potential curve relating to FIGS. 3 and 5;

FIG. 7 is a graphic illustration of an operational diagram relating to a portion of the circuit of FIG. 1;

DESCRIPTION OF THE PREFERRED EMBODIMENTS

Figure 1:
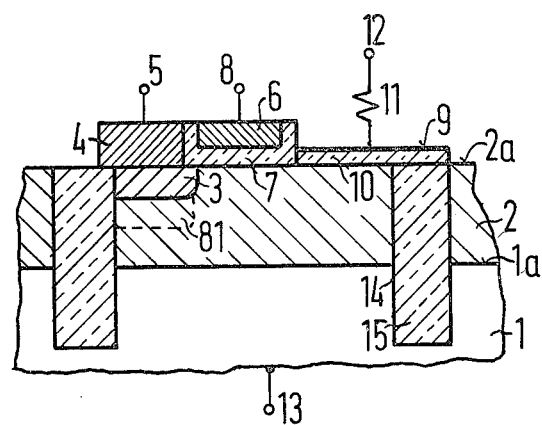
FIG. 1 is a schematic cross-section of a memory cell constructed in accordance with the present invention.

Referring to FIG. 1, a memory cell is illustrated as comprising a doped semiconductor body, for example consisting of n-conductive silicon, which is covered with a semiconductor layer 2 of opposite conductivity, for example consisting of p-conductive silicon. At the boundary surface 2a of the semiconductor layer 2, a region 3, oppositely doped to the layer, is provided, which in the present example would be n-conductive. A first drive line (bit line), illustrated as a conductive coating 4 with a terminal 5, contacts the region 3. A gate 6 is arranged adjacent the region 3, the gate 6 being separated from the boundary surface 2a by a gate insulation 7 and electrically insulated with respect to the adjacent circuit portions in the lateral direction as well by lateral portions of the layer representing the gate insulation which, for example, consists of SiO$_2$. The gate 6 represents a portion of a second drive line (word line) which has an end terminal 8, or is connected to a word line by way of the terminal 8. An electrically conductive coating 9 is provided next to the gate 6, the coating 9 being separated from the surface 2a by a very thin electrically insulating layer 10 consisting, for example, of SiO$_2$. The thickness of the layer 10 is selected in such a manner that it admits a tunnel current between the boundary surface 2a and the conductive coating 9. The conductive coating 9 is connected by way of a load element, schematically illustrated in FIG. 1 as a resistor, to a terminal 12 which is connected to a voltage V$_D$. The semiconductor body 1 has a terminal 13 to which a voltage V$_{Sub}$ is supplied. The memory cell is surrounded by a trough-like recess 14 which extends from the boundary surface 2a into the semiconductor body 1 and is filled with an electrically insulating layer, in particular an oxide layer 15. The circuit portions 14, 15 can also be replaced by a semiconductor zone extending in the vertical direction from the boundary surface 2a down to the boundary surface 1a and corresponding in its lateral directions approximately to the dimensions of the recess 14, the semiconductor zone having a conductivity which corresponds to that of the semiconductor body 1.

Figure 2:
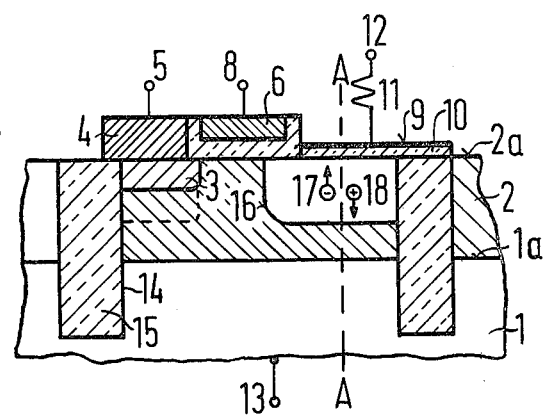
FIG. 2 is a schematic cross section of the memory cell of FIG. 1 illustrating a first operating state.

FIG. 2, first, illustrates a first operating state of the memory cell schematically illustrated in FIG. 1. The voltage $V_D$ constantly supplied to the terminal 12 effects the build-up of a depletion zone 16 beneath the conductive coating 9. The negative charge carriers 17 thermally generated in the zone 16 move under the influence of the electrical field prevailing in the zone to the boundary surface 2a, whereas the positive charge carriers 18 are transported to the terminal 13. The very thin insulating layer 10 allows the passage of the negative charge carriers 17 which are then, in turn, supplied to the terminal 12 so that a generation current traceable to the charge carriers 17 and 18 flows between the terminals 12 and 13.

Figure 3:
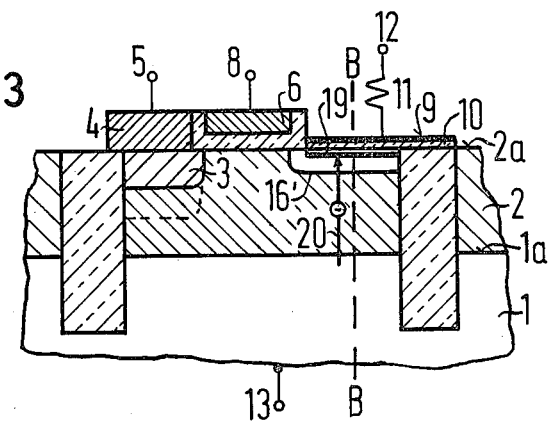
FIG. 3 is a schematic cross section of the memory cell of FIG. 1 illustrating a second operating state.

The operating state illustrated in FIG. 3 differs from that according to FIG. 2 in that an inversion layer or, respectively, inversion charge 19 is located at the boundary surface 2a beneath the conductive coating 9, the depletion zone 16 being reduced under the influence of the inversion layer or, respectively, inversion charge 19. The circuit portions 19, 2 and 1 represent a bipolar transistor whose emitter zone is formed by a semiconductor body 1 and whose base region is formed by the semiconductor layer 2. The collector of this transistor is represented by the inversion layer 19. Under the influence of the voltage $V_D$, an injection current consisting of negative charge carriers and indicated by the arrow 20 arises, the negative charge carriers being injected from the semiconductor body 1 by way of the boundary surface 1a into the layer 2 and arriving at the inversion collector 19. A significantly greater tunnel current arises through the insulating layer 10 than in the operating state according to FIG. 2, whereby the negative charge carriers again arrive at the terminal 12. Therefore, an injection current whose magnitude is determined by the tunnel current exists between the terminals 12 and 13. FIG. 4 illustrates a potential curve $\phi$ along the line A—A of FIG. 2, while FIG. 5, in its upper portion, illustrates a cross-sectional view through the arrangement according to FIG. 2 which extends perpendicularly to the plane of the drawing of FIG. 2 and contains the line A—A. The circuit portions 1, 2 and 9-13 of FIG. 5 have already been described on the basis of FIGS. 1 and 2. The potential curve $\phi$ indicated in FIG. 4 over the distance Z from the upper end of the load element 11 reveals that the small generation current effects a very small potential drop at the load element 11. The potential drop occurring at the insulation layer 10 is referenced 20. The potential $\phi$ decreases in the depletion zone 16 to the potential $\phi1$ of the semiconductor layer, whereas there is a potential rise 23 in the depletion zone 21 which is constructed together with the depletion zone 22 at the boundary plane 1a, the potential rise 23 being approximately to the value 24 which corresponds to the potential of the semiconductor body 1.

FIG. 6 illustrates the potential curve $\phi$ along a line B—B of FIG. 3 in a diagram corresponding to FIG. 4, whereby a smaller depletion zone 16' is now taken into consideration, which is indicated in FIG. 5. The significantly greater injection current produces a voltage drop 25 at the load element 11, an increased voltage drop 20' at the insulation layer 10, a reduced voltage drop within the depletion zone 16' to the value $\phi1'$ of the layer 2 now increased by some forward bias FS, and a reduced potential rise 23' to approximately the value 24, which again corresponds to the potential of the semiconductor body 1.

The current/voltage characteristic of a bistable element consisting of the parts 2, 16, 10 and 9 is illustrated in FIG. 7. In this diagram, the current I flowing through the element is indicated with respect to the voltage V applied to the elements 2 and 9. The characteristic exhibits two branches 25 and 26 which, together with a resistance line 27 corresponding to the load element 11, produces two intersection points 28 and 29. Each of these points of intersection represents a stable working point of the tunnel element.

The elements 10, 9, 16 and 2, together with the load element 11 and the semiconductor element 1, form a partial circuit which is operated in the two stable switching states defined by the working points 28 and 29, whereby the selection between the working points 28 and 29 occurs due to the magnitude of the current flowing between the terminals 12 and 13. If no inversion charge 19 exists (FIG. 2), then a small generation current flows which, via the characteristic according to FIG. 7, effects a setting to the voltage 20 or, respectively, to the working point 28. Given the existence of an inversion charge according to FIG. 3, the working point 29 is set due to the existence of the large injection current which allows a voltage 20' to drop by way of the insulation layer 10. The injection current prevents a disintegration of the inversion charge 19, whereas, in the first case, the small tunnel current corresponding to the generation current prevents the build-up of an undesired inversion charge at the interface 2a below the conductive coating 9.

The memory element is now operated in such a manner that, for writing a first digital information which, for example, is provided by a logical "0", the bit line 4 has a high potential $V_0$ applied thereto by way of the terminal 5. The word line 6 is connected to a gate voltage $V_G$ by way of its terminal 8, the gate voltage $V_G$ inverting the semiconductor layer beneath the gate 6 and resulting in the build-up of a transfer channel at the boundary surface 2a. The voltage $V_D$ at the terminal 12 generates a surface potential at the boundary surface 2a below the conductive coating 9, the surface potential being smaller than the potential of the region 3 connected to the bit line 4. Therefore, no charge carriers are transported out of the region 3 to the boundary surface 2a beneath the insulator 10 and no inversion charge is formed at that location. By so doing, the operating state described on the basis of FIG. 2 arises in which a small generation current flows and the working point 28 is set. After writing of the digital information, the voltage $V_G$ is switched off and the bit line 4 is thus separated from the memory element.

For writing the second digital information which, for example, is given by a logical "1", the bit line 4 is connected by way of the terminal 5 to a low voltage $V_1$. The gate voltage $V_G$ generating a transfer channel is again supplied to the terminal 8. Charge carriers are injected from the region 3 into the semiconductor layer 2 and collect beneath the conductive coating 9 connected to the voltage $V_D$ in the form of an inversion charge. There follows the operating state according to FIG. 3 in which a large injection current flows which corresponds to the working point 29. The injection current maintains the inversion charge after the disconnection of the voltage $V_G$ or, respectively, the disconnection of the bit line 4 from the memory element.

The stored digital information which derives from the presence or absence of the inversion charge 19 is now maintained by the stationary working points 28 and 29 without requiring periodic regeneration.

For reading the stored information, the bit line 4 is first reset to a reference potential and is subsequently disconnected from external potentials so that it is in a "floating" state. Subsequently, the gate 6 is again charged with the gate voltage $V_G$. Differing potential changes which arise on the bit line 4 as a function of the presence or absence of an inversion charge 19 are evaluated as read-out signals for various stored digital information in that the same are supplied to the gate of an input field effect transistor of an evaluator stage and influence the current flowing through the stage, whose voltage drop at a load element can be used as the basis for a further logical processing. Advantageously, the bit line 4 is reset to a high reference potential for the purpose of reading, so that, upon reading a logical "1", a noticeable voltage drop occurs on the bit line 4 due to the charge carriers penetrating into the region 3, whereas, upon reading a logical "0", the reset potential is retained on the bit line 4 due to the lack of an inversion charge 19.

Figure 8:
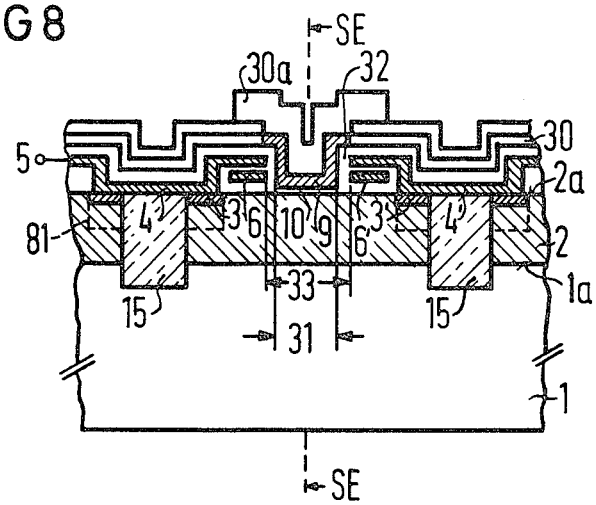
FIG. 8 is a schematic cross section of an embodiment of the memory cell of FIG. 1.

FIG. 8 illustrates an advantageous embodiment of a memory cell constructed in accordance with the present invention. The gate 6 is designed as a portion of a conductive coating of a first plane which represents the word line. The bit line 4 consists of a conductive coating in the form of a meander-like strip which contacts the region 3 and extends beyond the contact area in a second plane above the plane of the gate 6. A further portion of a meander-like coating 30 represents the conductive coating 9 (FIG. 1). The conductive coatings 4 and 6 preferably consists of highly doped polycrystalline silicon and are separated from one another by intermediate insulating layers 32, preferably consisting of $SiO_2$. A recess 31 of the intermediate insulating layers 32 lies within a recess 33 of the coatings 4 and 6 and extends down to the boundary surface 2a covered with the very thin insulating layer 10, the coating 30 extending in the recess 31 down to the insulating layer 10. In order to form the load element 11, the coating 30 can be weakly doped in the area of the recess, whereas it is not doped in its other portions. The greater the doping, the smaller the resistance of the load element. The connection of the load element 11 to the terminal 12 occurs in FIG. 8 by way of a strip-like metallization 30a which extends parallel to the plane of the drawing in the recess and perpendicular to the plane of the drawing across the memory configuration.

A symmetrical further development of the arrangement according to FIG. 1 is also illustrated in FIG. 8 in which two transfer elements 3-6 or, respectively, 3'-6' are arranged to the left and the right of a central plane of symmetry SE, the transfer elements adjoining a common, thin insulating layer 10 and a common, conductive coating 9.

Figure 9:
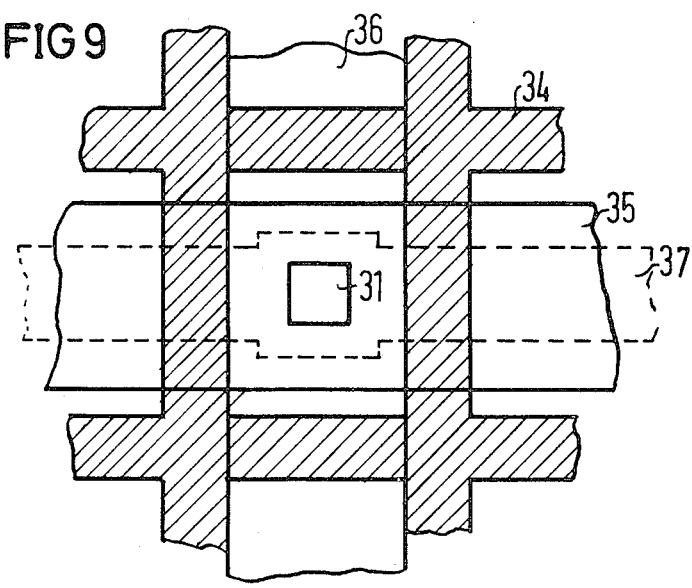
FIG. 9 is a plan view illustrating the layout of the embodiment according to FIG. 8.
Figure 10:
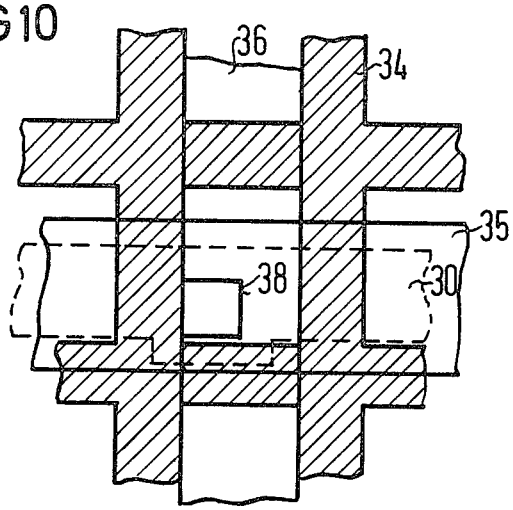
FIG. 10 is a plan view illustrating the layout of an alternative embodiment relating to FIG. 8.

FIG. 9 illustrates the layout of the arrangement according to FIG. 8. The insulation zones 14, 15 are indicated by shaded strips 34, whereas the word line 6 is indicated by a strip 35, the bit line 4 by a strip 36 and the coating 30 by a strip 37. The recess 31 in FIG. 8 is correspondingly identified in FIG. 9. A recess 38 (FIG. 10) which corresponds to the recess 31 is provided in an alternate layout and is located, however, in a corner of the semiconductor surface provided for a memory cell and enclosed by the insulation zones 14, 15.

Figure 11:
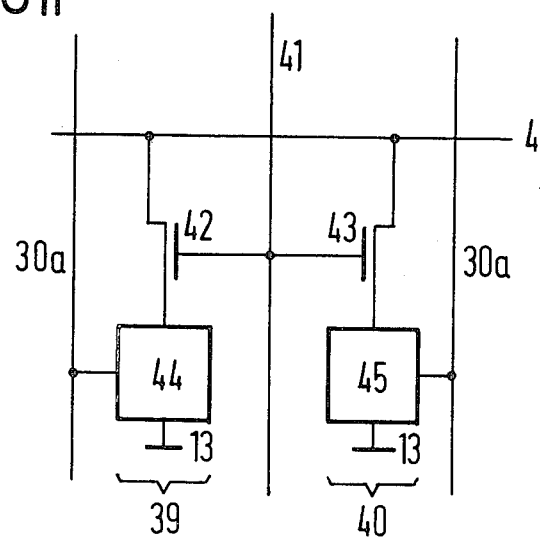
FIG. 11 is a schematic circuit diagram of the organization of a semiconductor memory constructed with the memory cells of the present invention.

An advantageous organizational form of a memory matrix constructed of memory cells according to the present invention is illustrated in FIG. 11. The transfer elements of the memory cells are referenced 42 and 43, whereas the bistable circuits 1, 2, 9, 10 and 11 of the memory cells are indicated by the blocks 44 and 45. The memory cells 39 and 40 of a matrix line have a common bit line 4, whereas the memory cells of a column have a common word line 6 which, in the case of FIG. 11 are illustrated by a word line 41 lying between two columns, the word line 41 being common to all memory cells of these two columns. The strip-like metallizations 30a extend parallel to the word lines 41, whereas the ground terminals of the bistable circuits 44, 45 are formed by the terminal 13 of the semiconductor body 1.

If, in the embodiment according to FIG. 8, the load element 11 is to have a small resistance or is to be entirely eliminated, then that part of the coating 30 formed of polysilicon lying in the area of the recess 31 is highly doped. Given a weak doping, this portion of the coating 30 represents an element which corresponds to the elements 9 and 11 of FIG. 1. On the other hand, the layer 10 can be omitted in FIG. 8 when that part of the polysilicon 30 then contacting the boundary surface 2a remains undoped.

The thin insulating layer 10, for example, can be realized by a $SiO_2$ layer having a layer thickness of approximately 30-60 Å or by means of an undoped polysilicon layer having a layer thickness of a magnitude of 4000 Å.

For the case in which the layer 10 of FIG. 8 is omitted, that portion of the polysilicon coating 30 contacting the boundary surface 2a can be designed in such a manner that it receives a weak doping, indicated by a broken line 50 at the surface facing the strip-like metallization, so that the boundary surface between the elements 30 and 30a represent a Schottky junction in the area of the doping operated in the pass-through direction, the Schottky junction corresponding to the load element 11.

Advantageously, a zone of the semiconductor layer 2, referenced 81 (FIG. 1, FIG. 8) receives a higher doping than the remaining portion of the zone 2 in order to suppress an undesired npn transistor action between the elements 1, 2 and 3, given which charge carriers injected from the semiconductor body 1 proceed by way of the semiconductor layer 2 into the region 3. An arrangement corresponding to the elements 1, 2, 9, 10, 11 and 12 is described in the essay "*Steady State Characteristics of Two Terminal Inversion Controlled Switches*" by H. Kroger and Richard Wegener, printed in Solid State Electronics, Vol. 21, 1978, pp. 643-654.

In comparison to the potential at the terminal 13, the mentioned voltages and potentials have a positive operational sign when the semiconductor body 1 is designed with n-conductive material and the semiconductor layer is designed with p-conductive material. If the conductivities of the individual semiconductor regions are reversed, then voltages and potentials referred to the potential at the terminal 13 have a negative operational sign.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A monolithic static memory cell, comprising
a semiconductor body of a first conductivity type having a first surface;
a semiconductor layer of a second conductivity type carried on said first surface and having a second surface;
a region of said first conductivity type in said semiconductor layer extending to said second surface;
a first drive line carried on said second surface in electrical contact with said region;
a first insulator carried on said second surface adjacent said region;
a second drive line;
a gate carried on said first insulator and connected to said second drive line;
a second, thin insulator carried on said second surface over a zone of said semiconductor layer; and
a conductive coating carried on said second insulator and adapted to receive a potential to produce a tunnel current between said second surface and said conductive coating.

2. The memory cell of claim 1, and further comprising:
a load element connected to said conductive coating; and
a terminal connected to said load element for receiving the potential for producing the tunnel current.

3. The memory cell of claim 2, wherein said load element comprises:
a resistance layer applied to said conductive coating.

4. The memory cell of claim 3, and further comprising:
means defining a trough-like recess extending from said second surface downwardly below said first surface and defining the lateral extent of said memory cell; and
an electrically insulating layer filling the trough-like recess.

5. The memory cell of claim 4, wherein said electrically insulating layer is an oxide layer.

6. The memory cell of claim 3, and further comprising:
a zone of semiconductor material of the first conductivity type surrounding and defining the lateral extent of said memory cell.

7. The memory cell of claim 1, wherein:
said first drive line includes a portion extending over and insulated from said second drive line;
a strip-like coating of semiconductor material comprising said conductive coating as a doped part of it;
said first and second drive lines formed of first and second conductive layers;
a recess in said memory cell extending through said first and second conductive layers down to said second insulator and having isolated walls; said strip-like coating covering said isolated walls and said second insulator;
an additional conductive coating is carried on said doped part of said strip-like coating.

8. The memory cell of claim 7, wherein:
said doped part of said coating of semiconductor material is weakly doped and constitutes a load element.

9. The memory cell of claim 1, wherein:
said second drive line lies in a first plane;
said first drive line includes a portion lying in a second plane overlying said second drive line;
an insulated recess is formed in said drive lines down to said second surface; and
a layer of semiconductor material is carried insulated over said first drive line and in said recess, said layer of semiconductor material consisting of undoped polysilicon, the part of which layer covering said second surface constituting said second insulator.

10. The memory cell of claim 9, and further comprising:
a further conductive layer carried on said layer of semiconductor material; and wherein
said layer of semiconductor material is weakly doped on the side facing said further conductive layer and constituting a load element.

11. The memory cell of claim 1, and further comprising:
a second region below the first-mentioned region and doped to a higher degree than the remainder of the semiconductor layer.

12. The memory cell of claim 1, wherein:
said second insulator is an oxide layer.

13. The memory cell of claim 1, wherein:
said second insulator is undoped polysilicon.

14. The memory cell of claim 1, and further comprising:
a plurality of said memory cells in a rows and columns with a common first drive line for the memory cells of a row, and a common second drive line for the memory cells of a column and a common terminal therefor.

15. A method of operating a memory cell of the type wherein a semiconductor body of a first conductivity type carries on a first surface a semiconductor layer of a second conductivity type having a second surface, a region of the first conductivity type extends into the semiconductor layer from the second surface, a first drive line is carried on the second surface in contact with the region, a gate is carried insulated from the second surface adjacent the region, a second drive line is connected to the gate, a thin insulator is carried on the second surface adjacent the gate and a conductive coating is carried on the thin insulator for receiving a potential to produce a tunnel current between the second surface and the conductive coating, comprising the steps of:
for writing a predetermined digital information,
applying a first voltage to the gate to create an inversion channel at the second surface beneath the gate;
applying a second voltage to the first drive line to suppress charge carrier transport from the region to the second surface below the conductive coating; and
applying a third voltage across the semiconductor body and conductive coating to create a depletion zone at the second surface beneath the conductive coating to generate a small tunnel current and set a stable working point representing the information.

16. The method of claim 15, for reading the stored information comprising the steps of:
resetting the first drive line to a reference potential and subsequently disconnecting the first drive line from external potentials; applying the first voltage to the gate; and measuring the potential change on the first drive line to determine the presence or absence of an inversion layer.

17. A method of operating a memory cell of the type wherein a semiconductor body of a first conductivity type carries on a first surface a semiconductor layer of a second conductivity type having a second surface, a region of the first conductivity type extends into the semiconductor layer from the second surface, a first drive line is carried on the second surface in contact with the region, a gate is carried insulated from the second surface adjacent the region, a second drive line is connected to the gate, a thin insulator is carried on the second surface adjacent the gate and a conductive coating is carried on the thin insulator for receiving a potential to produce a tunnel current between the second surface and the conductive coating, comprising the steps of:

for writing a predetermined digital information,
applying a first voltage to the gate;
applying a low second voltage to the region to transport charge carriers therefrom to the second surface beneath the conductive coating to form an inversion layer; and
applying a third voltage across the conductive coating and semiconductor body to provide an injection current therebetween and set a stable working point representing the information.

18. The method of claim 17, for reading the stored information comprising the steps of:
resetting the first drive line to a reference potential and subsequently disconnecting the first drive line from external potentials;
applying the first voltage to the gate; and
measuring the potential change on the first drive line to determine the presence or absence of an inversion layer.

* * * * *